(12) United States Patent
Park et al.

(10) Patent No.: US 7,944,682 B2
(45) Date of Patent: May 17, 2011

(54) GASKET, SCREEN SPACER, AND DISPLAY DEVICE WITH GASKET AND SCREEN SPACER

(75) Inventors: Dong-Joon Park, Asan-si (KR); Ha-Yun Kang, Asan-si (KR); Gun-Ho Kim, Yongin-si (KR); Duk-Hwan Kang, Incheon (KR); Jae-Kook Kim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 235 days.

(21) Appl. No.: 12/169,060

(22) Filed: Jul. 8, 2008

(65) Prior Publication Data

US 2009/0168314 A1   Jul. 2, 2009

(30) Foreign Application Priority Data

Jan. 2, 2008   (KR) .................. 10-2008-0000198

(51) Int. Cl.
*H05K 5/00* (2006.01)
*H05K 7/00* (2006.01)
*G02F 1/1333* (2006.01)

(52) U.S. Cl. ......... 361/679.21; 361/679.22; 361/679.26; 361/679.29; 361/679.3; 349/58; 349/59; 349/60

(58) Field of Classification Search ............. 361/679.21, 361/679.22, 679.26, 679.29, 679.3; 174/564, 174/358; 349/58, 59, 60
See application file for complete search history.

(56) References Cited

U.S. PATENT DOCUMENTS

| | | | | |
|---|---|---|---|---|
| 4,857,668 A | * | 8/1989 | Buonanno | 174/354 |
| 2007/0273807 A1 | * | 11/2007 | Yun | 349/58 |
| 2008/0078574 A1 | * | 4/2008 | Kang et al. | 174/358 |

FOREIGN PATENT DOCUMENTS

| | | |
|---|---|---|
| JP | 11143396 | 5/1999 |
| KR | 1020050068556 A | 7/2005 |
| KR | 1020070047962 A | 5/2007 |

* cited by examiner

*Primary Examiner* — Jayprakash N Gandhi
*Assistant Examiner* — Anthony M Haughton
(74) *Attorney, Agent, or Firm* — Cantor Colburn LLP

(57) ABSTRACT

A gasket includes an elastic member absorbing an external shock, a conductive member surrounding the elastic member, and a reinforcing member disposed within the conductive member and extending along a bottom surface and a side surface of the conductive member. A screen spacer includes an elastic member absorbing an external shock, and a reinforcing member disposed on one side of the elastic member. A display device includes a driving circuit substrate supplying a driving signal to a display panel, a chassis receiving the display panel and the gasket attached to the driving circuit substrate and contacting the chassis, the gasket grounding the driving circuit and the chassis.

19 Claims, 4 Drawing Sheets

US 7,944,682 B2

GASKET, SCREEN SPACER, AND DISPLAY DEVICE WITH GASKET AND SCREEN SPACER

This application claims priority to Korean Patent Application No. 2008-0000198, filed on Jan. 2, 2008, and all the benefits accruing therefrom under 35 U.S.C. §119, the contents of which is incorporated herein by reference in its entirety.

BACKGROUND OF THE INVENTION

1. Field of the Invention

The present invention relates to a gasket, a screen spacer, and a display device with a gasket and a screen spacer, and more particularly, the present invention relates to a gasket, a screen spacer, and a display device with a gasket and a screen spacer in which an electromagnetic interference is efficiently shielded.

2. Description of the Related Art

Electronic devices such as a mobile communication terminal, a television, and a notebook computer have a display device for displaying images. Such electronic devices often employ a flat panel display device as a display device.

A liquid crystal display ("LCD") device, as a representative flat panel display device, displays images by using electrical and optical characteristics of a liquid crystal. An LCD device has advantages of thin thickness, light weight, low power consumption, and low driving voltage, and thus it has been widely used in a display industry.

An LCD device sensitively reacts to electromagnetic interference ("EMI") that causes an obstacle in device performance due to emission or conduction of an electromagnetic wave. In order to shield electromagnetic interference, an LCD device enhances a grounding ability by contacting a gasket attached to a ground pad of a circuit board to a top and bottom chassis made of a conductive material. A gasket for improving a grounding ability may be formed at a height sufficient to contact a top chassis.

BRIEF SUMMARY OF THE INVENTION

While a gasket may be used in an LCD device to improve a grounding of a circuit element and a chassis of the LCD device, there are difficulties in maintaining a form (or shape) of the gasket, and in reducing or effectively preventing a short circuit between a circuit element and a chassis of the LCD device. For example, a gasket may be severely compressed or deformed by pressure transferred to the gasket by the chassis, when an external force contacts or acts upon the chassis. When the gasket is undesirably compressed or deformed, a significant difference in a contact area between the gasket and other conductive features of the LCD device occurs, causing irregular electromagnetic interference. When a side of the gasket is deformed, the chassis may contact the circuit element mounted on a circuit board, causing an electrical short circuit between the chassis and the circuit board, thereby leading to a malfunction of the LCD device. Therefore, a gasket resisting compression and deformation, while substantially maintaining a separation of the chassis and the circuit board of an LCD device is desired.

An exemplary embodiment provides a gasket, a screen spacer and a display device with a gasket and a screen spacer in which defects in the display device resulting from a gasket being undesirably compressed or deformed, and/or contacting a chassis of the display device are reduced or effectively prevented.

In an exemplary embodiment of the present invention, a gasket includes an elastic member absorbing an external shock, a conductive member surrounding an outer surface of the elastic member, and a reinforcing member disposed within the conductive member, such as between the elastic member and the conductive member, and extending along a bottom surface and a side surface of the conductive member.

The reinforcing member may be made substantially thin and/or plate-shaped, having characteristics of rigidity and flexibility. The reinforcing member may include polyethylene terephthalate ("PET"). The reinforcing member may be disposed substantially in an "L" shape, extending along and contacting a bottom surface and one side of the elastic member. Alternatively, the reinforcing member may be disposed substantially in a "U" shape, extending along and contacting a bottom surface and opposing sides of the elastic member.

The conductive member may include non conductive fabric covered with a conductive material, such as by a plating process. The conductive member may be disposed such that end portions of the conductive member overlap each other and a whole of the bottom of the elastic member.

The gasket may further include a conductive adhesion member disposed on an outer surface of the conductive member.

The elastic member of the gasket may include a sponge-like material.

In an exemplary embodiment of the present invention, a screen spacer includes an elastic member configured to absorb an external shock, and a reinforcing member combined with the elastic member.

The screen spacer may further include an adhesion member combining the reinforcing member with the elastic member, and disposed on an outer surface of the reinforcing member.

The reinforcing member may include a substantially thin plate having rigidity.

The elastic member may include sponge-like material.

In an exemplary embodiment of the present invention, a display device includes a display panel displaying images, a driving circuit substrate supplying a driving signal to the display panel, a chassis surrounding an edge of the display panel, and a gasket attached to the driving circuit substrate and contacting the chassis.

The gasket includes an elastic member absorbing an external shock, a conductive member contacting an outer surface of the elastic member, such that the conductive member surrounds the elastic member, and a reinforcing member disposed between the elastic member and the conductive member, and extending along a bottom surface and a side surface of the conductive member. The gasket grounds the driving circuit substrate and the chassis.

The reinforcing member may be formed substantially in a thin plate shape having rigidity and flexibility. The reinforcing member may be disposed substantially in an "L" shape, extending along a bottom surface and one side surface of the elastic member. Alternatively, the reinforcing member may be disposed substantially in a "U" shape, extending along a bottom surface and opposing side surfaces of the elastic member.

The conductive member may include non conductive fabric plated with a conductive material. The conductive member may be disposed such that distal ends of the conductive member overlap each other and a whole of the bottom of the elastic member.

The display device may further include a screen spacer disposed on the driving circuit substrate, and between the driving circuit substrate and the chassis. The screen spacer may include an elastic member and a reinforcing member disposed on a bottom of the elastic member.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
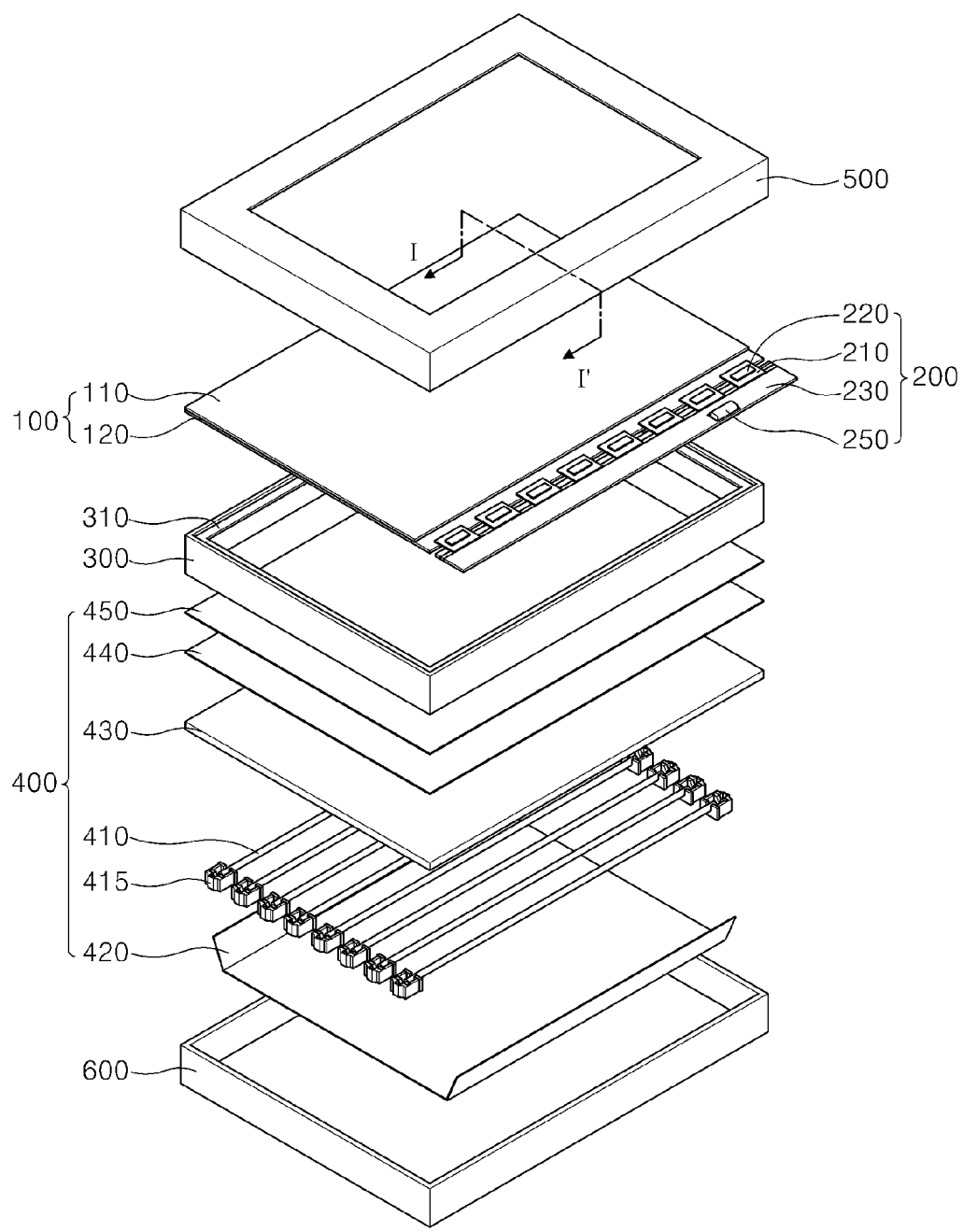
FIG. 1 is an exploded perspective view illustrating an exemplary embodiment of a display device according to the present invention.

Reference will now be made in detail to the embodiments of the present invention, examples of which are illustrated in the accompanying drawings, wherein like reference numerals refer to the like elements throughout. The embodiments are described below in order to explain the present invention by referring to the figures. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2:
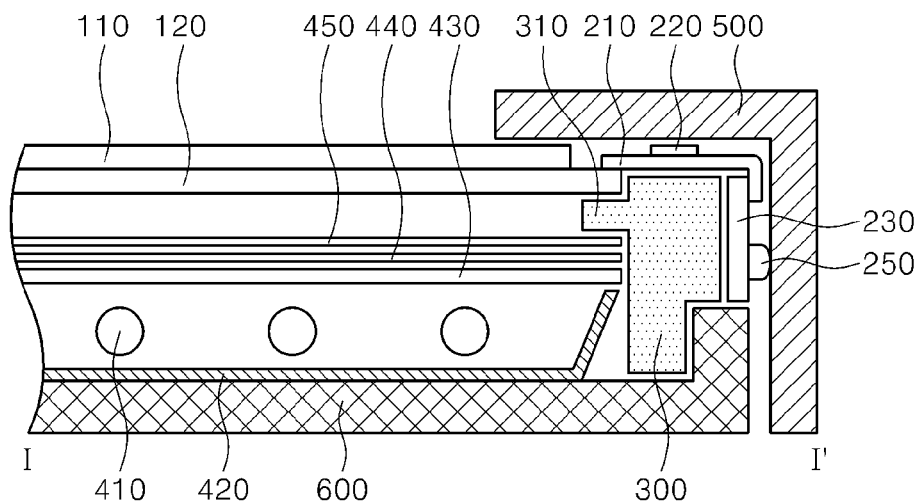
FIG. 2 is a cross-sectional view taken along line I-I' of FIG. 1.

FIG. 1 is an exploded perspective view illustrating an exemplary embodiment of a display device according to the present invention, and FIG. 2 is a cross-sectional view taken along line I-I' of FIG. 1.

Referring to FIGS. 1 and 2, the display device according to the illustrated exemplary embodiment of the present invention includes a display panel 100, a driving circuit portion 200, a mold frame 300, a backlight unit 400, a top chassis 500, and a bottom chassis 600. The display panel 100 is disposed at a front, or display side, of the display device.

The display panel 100 includes a color filter array substrate 110 and a thin film transistor ("TFT") array substrate 120 with a liquid crystal layer (not shown) for adjusting light transmittance interposed between the color filter array substrate 110 and the TFT array substrate 120.

The color filter array substrate 110 may include a black matrix (not shown) disposed in a matrix arrangement on an upper substrate (not shown) to shield light, red (R), green (G) and blue (B) color filters disposed in a region defined by the black matrix to realize various colors, and a common electrode for applying a common voltage to the liquid crystal layer. In exemplary embodiments, the upper substrate may include, but is not limited to, glass or plastic The TFT array substrate 120 includes a gate line (not shown) and a data line (not shown) which are disposed on a lower substrate (not shown) to cross each other, with a gate insulating layer (not shown) interposed therebetween, TFTs (not shown) electronically connected to the gate line and the data line, and a pixel electrode (not shown) for applying a pixel electrode to the liquid crystal layer. In exemplary embodiments, the lower substrate may include, but is not limited to, glass or plastic.

As illustrated in FIGS. 1 and 2, the driving circuit portion 200 includes a signal transmitting substrate 210, a driving integrated circuit ("IC") 220 mounted on the signal transmitting substrate 210, and a driving circuit substrate 230 for supplying electrical power and various signals to the display panel 100 through the signal transmitting substrate 210. The driving circuit portion 200 may further include a gasket 250 attached to the driving circuit substrate 230 to improve a grounding ability. The driving circuit portion 200 will be described later in more detail.

The mold frame 300 accommodates the display panel 100 to protect the display panel 100 from external shocks. The mold frame 300 includes an accommodating portion 310 for accommodating the display panel 100. In exemplary embodiments, the display panel 100 and/or other components of the display device may be accommodated in a receiving space of the mold frame 300, such as within sidewalls and a bottom member of the mold frame 300 defining the receiving space. The bottom member of the mold frame 300 may include an opening such that light can pass through to the display panel 100. In exemplary embodiments, the mold frame 300 may be made of a material for absorbing a shock, including but not limited to, plastic.

The backlight unit 400 is disposed below the display panel 100 (e.g., towards a rear of the display device) to provide light to the display panel 100. As illustrated in FIGS. 1 and 2, the backlight unit 400 includes a light source 410, a light source socket 415, a reflecting member 420, a light diffusing member 430, a light collecting member 440, and a protection member 450.

The light source 410 generates light to be provided to the display panel 100. As in the illustrated embodiment, the light source 410 may be of a direct below type in which it is disposed directly below the display panel 100 such that light is provided to the display panel 100 from directly below. As the light source 410, a cold cathode fluorescent lamp ("CCFL"), an external electrode fluorescent lamp ("EEFL"), and/or a plurality of light emitting diodes may be arranged.

Alternatively, the light source 410 may be of an edge type in which the light source 410 is disposed at a side or multiple sides of the display panel 100 such that light is initially provided to the display panel 100 from a side.

The light source socket 415 may be disposed at one or both ends of the light source 410, and fix the light source 410.

The reflecting member 420 may be substantially plate-shaped, and having a relatively high light reflectivity. The reflecting member 420 is disposed below the light source 410, or at a (rear) side of the display panel 100 opposing the display side. The reflecting member 420 is configured to upwardly reflect light toward the display panel 100, when the light is downwardly emitted from the light source 410, thereby reducing light loss.

The light diffusing member 430 diffuses light such that light emitted from light source 410 is uniformly provided to essentially a whole surface of the display panel 100. In exemplary embodiments, the light diffusing member 430 may include a diffusing plate and/or a thin diffusing sheet.

The light collecting member 440 collects light diffused by the light diffusing member 430, and causes the collected light to be substantially perpendicularly incident to the display panel 100. In exemplary embodiments, the light collecting member 440 may include, but is not limited to, a prism sheet having mountains of a prism form disposed at a surface from which light is emitted from the prism sheet.

The protection member 450 protects the light collecting member 440 from damage like scratches which may occur by friction with the display panel 100.

The top chassis 500 is arranged above the display panel 100 (e.g., at the front side of the display device) to protect the display panel 100 from external shocks. In the illustrated exemplary embodiment, the top chassis 500 may include a portion bent at substantially a right angle to surround an edge of the display panel 100 and a side of the mold frame 300. The top chassis 500 includes an aperture through which a display region of the display panel 100 is exposed. In exemplary embodiments, the top chassis 500 may be made of a conductive material and be electrically connected to the gasket 250, to thereby improve grounding performance.

The bottom chassis 600 accommodates the backlight unit 400 and protects the backlight unit 400 and other member received therein from external shocks. In exemplary embodiments, the bottom chassis 600 may be made of a conductive material and be coupled to the top chassis 500, to thereby more improve grounding performance.

Figure 3:
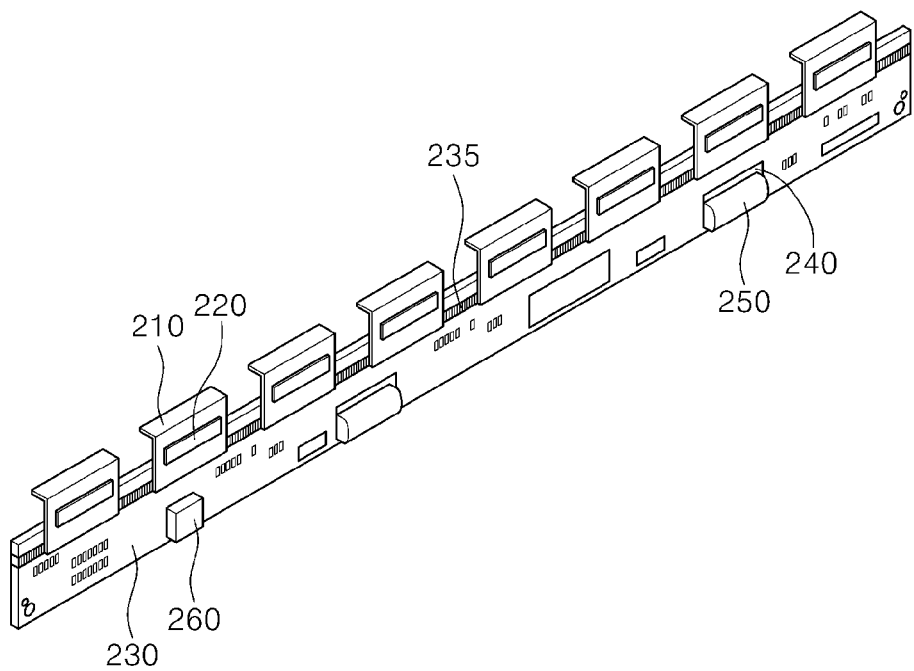
FIG. 3 is a perspective view illustrating an exemplary embodiment of a driving circuit portion of the display device of FIG. 1.

The driving circuit portion 200 of the display device of the illustrated exemplary embodiment is described below in detail with reference to FIG. 3. FIG. 3 is a perspective view illustrating an exemplary embodiment of the driving circuit portion of the display device of FIG. 1.

Referring to FIG. 3, the driving circuit portion 200 includes the signal transmitting substrate 210, the driving IC 220, the driving circuit substrate 230, the gasket 250, and a screen spacer 260.

The signal transmitting substrate 210 is made of a relatively thin substrate including a plurality of signal transmitting lines (not shown). In an exemplary embodiment, the signal transmitting substrate 210 may include a flexible printed circuit board ("FPCB"). The signal transmitting substrate 210 contacts a pad portion 235 of the driving circuit substrate 230, such as to be electrically connected to the driving circuit substrate 230.

The driving IC 220 may be formed in a substantially rectangular form, and be mounted on one side (e.g., face) of the signal transmitting substrate 210. The driving IC 220 receives a signal from the driving circuit substrate 230 through the signal transmitting substrate 210.

The driving circuit substrate 230 is formed such that various circuit elements are mounted on a printed circuit board ("PCB"). The driving circuit substrate 230 includes the pad portion 235 and a ground pad 240 which are made of a conductive material.

The pad portion 235 may include a single continuous pad or a plurality of pads made of a conductive material which are disposed on an outer face, such as near or adjacent to an upper edge, of the driving circuit substrate 230, such as illustrated in FIG. 3. The pad portion 235 is electrically connected to the signal transmitting substrate 210. The pad portion 235 serves as a terminal for outputting to the signal transmitting substrate 210 electrical power and various signals to be supplied to the display panel 100.

The ground pad 240 is formed in a substantially rectangular form an outer face, such as in a lower portion or adjacent to a lower edge of the driving circuit substrate 230, such as illustrated in FIG. 3. In exemplary embodiments, the ground pad 240 is made of a conductive material and grounds an electromagnetic wave caused by electrical power and various signals.

The gasket 250 is formed at a predetermined height (or distance) protruded from the outer face and in a direction away from the outer face of the driving circuit substrate 230. The gasket 250 is attached to the ground pad 240. In exemplary embodiments, the gasket 250 may be made of a conductive material and contacts the top chassis 500. A top or uppermost portion of the gasket 250 may contact an inner face of the top chassis, as illustrated in FIG. 2. Advantageously, the gasket 250 electrically connected to the top chassis 500 efficiently grounds an electromagnetic wave caused by electrical power and various signals. Also, since the gasket 250 is electrically connected to the bottom chassis 600 coupled to the top chassis 500, the grounding performance is further improved.

The screen spacer 260 disposed on the outer surface of the driving circuit substrate 230. The screen spacer 260 is disposed between the driving circuit substrate 230 and the top chassis 500, and maintains a gap between the top chassis 500 and the driving circuit substrate 230. Advantageously, the screen spacer 260 reduces or effectively prevents an electrical short circuit between circuit elements of the driving circuit substrate 230 and the top chassis 500. In exemplary embodiments, the screen spacer 260 may be formed of an elastic member for reducing or effectively preventing external shocks to the display device, and is attached to the driving circuit substrate 230.

Exemplary embodiments of the gasket 250 are described below with reference to FIGS. 4 to 6.

Figure 4:
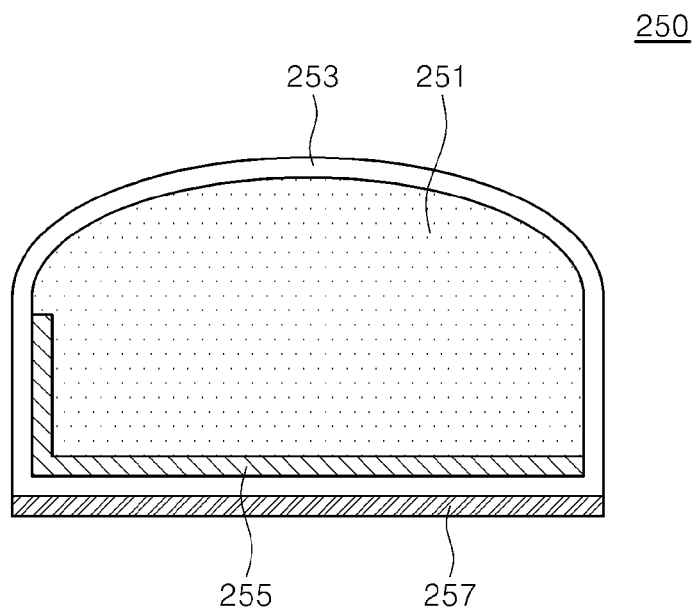
FIG. 4 is a cross-sectional view illustrating an exemplary embodiment of a gasket according to the present invention.

FIG. 4 is a cross-sectional view illustrating an exemplary embodiment of a gasket according to the present invention.

As shown in FIG. 4, the gasket 250 includes an elastic member 251, a conductive member 253, a reinforcing member 255, and a conductive adhesion member 257.

The elastic member 251 is formed at the predetermined height to reduce external shocks. Referring to FIGS. 4-6, the height is taken in a vertical direction, such as extending from the reinforcing member 257 towards the uppermost or top portion of the gasket 250. In one exemplary embodiment, the elastic member 251 of the gasket 250 is formed at the height corresponding to a distance between the top chassis 500 and the driving circuit substrate 230, and more particularly, a distance between the outer surface of the driving circuit substrate 230 and the inner face of the top chassis 500. The elastic member 251 may be formed of a sponge-like material to serve as a cushion.

Figure 5:
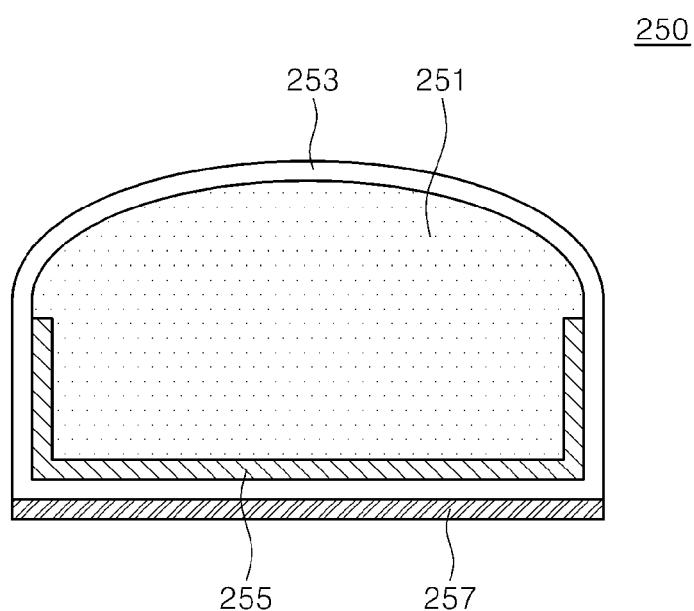
FIG. 5 is a cross-sectional view illustrating another exemplary embodiment of a gasket according to the present invention.
Figure 6:
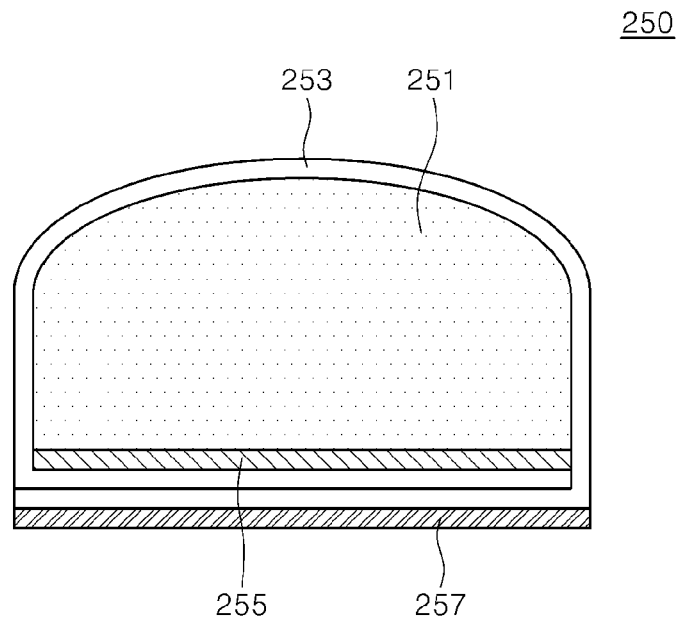
FIG. 6 is a cross-sectional view illustrating another exemplary embodiment of a gasket according to the present invention.

As illustrated in FIGS. 4-6, the elastic member 251 may include a substantially flat bottom surface which is opposite to the uppermost or top portion of the gasket 250, and taken in a horizontal direction. The elastic member 251 may include a substantially perpendicular side extending vertically from the bottom surface towards the top portion of the gasket 250. A transition from the side of the elastic member 251 to the top portion may be of a substantially semicircular shape or profile. However, a shape of the elastic member 251 is not limited to the above-described form, and may be formed in various forms as is suitable for the purposes described herein, such as being sufficiently effective to absorb external shocks to the display device.

The conductive member 253 is made of a conductive material and surrounds the elastic member 251. The conductive member 253 contacts an outer surface of the elastic member 251, and substantially conforms to the shape or profile of the elastic member 251. The conductive member 253 may include a substantially flat bottom surface, a substantially perpendicular side extending vertically from the bottom surface towards the top portion of the gasket 250, and a substantially semicircular shape or profile connecting the bottom surface and the side, similar to the elastic member 251. The conductive member 253 may be a single and continuous unit, such as totally enclosing the elastic member 251.

The conductive material 253 may be disposed on the elastic member 251 by plating non-conductive fabric with a conductive material. In an exemplary embodiment, the conductive member 253 is formed such that polyester fabric is plated with copper (Cu) and nickel (Ni) and then is adhered to the elastic member 251 through a hot-melt adhesive. In this process, a portion of the conductive member 253 corresponding to the bottom of the elastic member 251 is flatwise formed. That is, the conductive member 253 is formed such that an adhering surface of the gasket 250 can be substantially uniform when the gasket 250 is adhered to the ground pad 240. Advantageously, an adhesive force between the gasket 250 and the ground pad 240 of the driving circuit substrate 230 is improved, and a contact area is increased, leading to improved grounding performance.

As illustrated in FIGS. 4-6, the reinforcing member 255 is disposed between portions of the elastic member 251 and the conductive member 253. The reinforcing member 255 may be a single continuous member and/or be disposed on multiple portions of an inner surface of the conductive member 253, such as to be considered disposed "within" the conductive member 253. The reinforcing member 255 may be disposed such that no portion of the reinforcing member 255 is exposed to an outside of the conductive member 253.

In the illustrated embodiment of FIG. 4, the reinforcing member 255 is disposed substantially in an "L" shape, such that the reinforcing member is disposed along one side and a whole of the bottom of the elastic member 251. A substantially perpendicular portion (e.g., a vertical portion as shown in FIG. 4) of the reinforcing member 255 is disposed along a side of the elastic member 251 located opposite to a combining direction of the top chassis 500 and the bottom chassis 600. Advantageously, the reinforcing member 255 makes an adhering surface to be adhered to the ground pad 240 substantially uniform, and reduces or effectively prevents the gasket 250 from being pushed or detached from the ground pad 240 by an external shock. Here, the external shock may include pressure applied to the gasket 250 when the top chassis 500 contacts the gasket 250.

Also, the reinforcing member 255 reinforces a rigidity of the gasket 250 which reduces of effectively prevents the one side of the elastic member 251 from being deformed by pressure vertically applied by the top chassis 500. Advantageously, the reinforcing member 255 reduced or effectively prevents an electrical short circuit which may occur between the conductive member 253 and circuit elements (not shown) mounted on a peripheral region of the ground pad 240 when the elastic member 251 is pressed down.

As illustrated in FIG. 4, the reinforcing member 255 is not disposed on the other side (e.g., the right side) opposing the one side of the elastic member 251, and so the elastic member 251 can be deformed at the other side to disperse pressure vertically applied by the top chassis 500. Advantageously, the gasket 250 including the reinforcing member 255 disposed only along one vertical side of the elastic member 251 efficiently disperses pressure applied by the top chassis 500 when it contacts the top chassis 500, and is efficiently deformed to prevent the top chassis 500 from coming off.

In exemplary embodiments, the reinforcing member 255 is made of a non-conductive material having rigidity and flexibility for suppressing or resisting the deformation of the elastic member 251, such that it may be moved or deformed itself, but generally resist the deformation. The reinforcing member 255 may include, but is not limited to, polyethylene terephthalate ("PET").

The conductive adhesion member 257 disposed on an entire of an outer surface of the bottom portion of the conductive member 273, serves to adhere the conductive member 253 to the ground pad 240 of the driving circuit substrate 230. The conductive adhesion member 257 may include a conductive material and/or a conductive adhesive. The conductive material may include fabric plated with a conductive material, such as a same material of the conductive member 253. The conductive adhesive may contain conductive powder. In one exemplary embodiment, the conductive adhesive is made of nickel (Ni) powder containing a nickel component.

FIG. 5 is a cross-sectional view illustrating another exemplary embodiment of a gasket according to the present invention.

As shown in FIG. 5, the gasket 250 includes an elastic member 251, a conductive member 253, a reinforcing member 255, and a conductive adhesion member 257. The gasket 250 of FIG. 5 is similar in configuration to that of FIG. 4 except for a configuration of the reinforcing member 255, and thus a description on the other elements is omitted.

The reinforcing member 255 is disposed between the elastic member 251 and the conductive member 253, and contacting only a portion of an inner surface of the conductive member 253. The reinforcing member 255 is disposed substantially in a "U" form along a whole of a bottom and both of vertical sides of the elastic member 251. The reinforcing member 255 is formed along both sides of the elastic member 251 to reinforce rigidity of the both sides of the elastic member 251. Advantageously, the reinforcing member 255 configured as illustrated in FIG. 5 makes an adhering surface of the gasket 250 to be adhered to the ground pad 240 substantially uniform, and indirectly reinforces an adhesive force between the gasket 250 and the driving circuit substrate 230, such that a separation of the gasket 250 from the ground pad 240 by an external shock is resisted.

Additionally, the reinforcing member 255 reduces or effectively prevents the both sides of the elastic member 251 from being deformed by pressure vertically applied by the top chassis 500. Advantageously, the gasket 250 maintains a gap between the top chassis 500 and the driving circuit substrate 230 to thereby reduce or effectively prevent an electrical short circuit which may occur between circuit elements of the driving circuit substrate 230 and the top chassis 500 as a result of an external shock.

FIG. 6 is a cross-sectional view illustrating another exemplary embodiment of a gasket according to the present invention.

As shown in FIG. 6, the gasket 250 includes an elastic member 251, a conductive member 253, a reinforcing member 255, and a conductive adhesion member 257. The gasket 250 of FIG. 6 is similar in configuration to that of FIGS. 4 and 5 except for configurations of the conductive member 253 and the reinforcing member 255, and thus a description on the other elements is omitted.

In an exemplary embodiment, the conductive member 253 is made of conductive fabric formed by plating non-conductive fabric with a conductive material. The conductive member 253 surrounds the elastic member 251 to be piled up over a whole of a bottom surface of the elastic member 251. The conductive member 253 is adhered to the elastic member 251 such that a surface of the gasket 250 to be adhered to the ground pad 240 is formed to be substantially flat.

As illustrated in FIG. 6, the conductive member 253 is disposed around the elastic member 253 such that both ends (e.g., distal ends) of the conductive member 253 overlap each other over the whole bottom surface such that a step difference does not occur on a bottom of the elastic member 251. The conductive member 253 is a single and continuous member from a first distal end to an opposite second distal end. When portions of the conductive member 253 immediately adjacent to the first and second distal ends are overlapped over the whole bottom surface of the reinforcing member 255, two layers of the conductive member 253 are disposed at the bottom surface when taken in a vertical direction of the gasket 250. A first layer of the conductive member 253 may include the first distal end, and a second layer may include the second distal end. The two layers of the conductive member 253 that overlap each other, directly contact each other as illustrated in the exemplary embodiment.

FIG. 6 shows the first distal end of the conductive member 253 disposed between an outer portion of the conductive member 253 contacting the conductive adhesion member 257 and the reinforcing member 255, and the second distal end is disposed and partially exposed at a left side of the gasket 250. However, the single conductive member 253 may be wrapped around the elastic member 251 in a reverse direction, such that the second distal end of the conductive member 253 is disposed between an outer portion of the conductive member 253 contacting the conductive adhesion member 257 and the reinforcing member 255, and the first distal end is disposed and partially exposed at a right side of the gasket 250. The conductive member 253 of the configuration shown in FIG. 6 advantageously improves a surface adhesive force of a surface to be adhered to the ground pad 240 and grounding performance.

The reinforcing member 255 is flatwise formed inside the conductive member 253 along only an entire of a bottom of the elastic member 251. The reinforcing member 255 makes an adhering surface of the gasket 250 to be adhered to the ground pad 240 substantially uniform, and indirectly reinforces an adhering force such that the gasket 250 is not easily separated from the ground pad 240 by an external shock.

Figure 7:
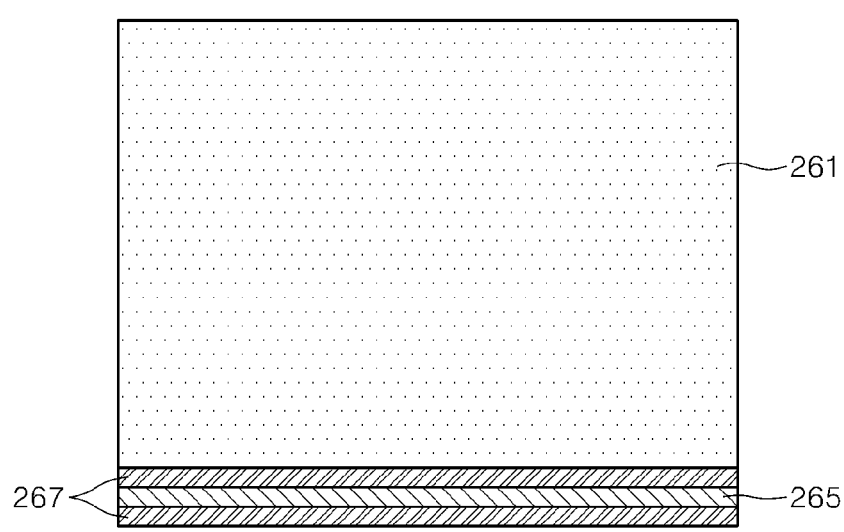
FIG. 7 is a cross-sectional view illustrating an exemplary embodiment of a screen spacer shown in FIG. 3.

The screen spacer 260 is described below in detail with reference to FIG. 7. FIG. 7 is a cross-sectional view illustrating an exemplary embodiment of the screen spacer shown in FIG. 3.

As shown in FIG. 7, the screen spacer 260 includes an elastic member 261, a reinforcing member 265 and an adhesion member 267.

The elastic member 261 is preferably formed at a height corresponding to a distance between the top chassis 500 and the driving circuit substrate 230. In exemplary embodiments, the elastic member 261 is made of a material for reducing an external shock, such as a sponge-like material. The elastic member 261 maintains a separation between the top chassis 500 and the driving circuit substrate 230 to reduce or effectively prevent the top chassis 500 and the driving circuit substrate 230 from contacting each other.

The reinforcing member 265 is made of a material with rigidity for maintaining a shape. In one exemplary embodiment, the reinforcing member 265 is made of PET, and promotes an adhering area of the screen spacer 260 to be substantially uniform to thereby enhance a surface adhesive force between the screen spacer 260 and the driving circuit substrate 230. The reinforcing member 265 is adhered to a whole of a bottom surface of the elastic member 261 to enhance an adhesive force between the elastic member 261 and the driving circuit substrate 230 when they are attached to each other. Advantageously, the reinforcing member 265 increases a uniform adhesive area to improve buffering performance of the elastic member 261 against an external shock to the display device.

The adhesion member 267 may be formed such that both of opposing sides can be adhered to other features of the display device. The adhesion member 267 may include a first sub-adhesion member and a second sub-adhesion member. As illustrated in FIG. 7, the first sub-adhesion member 267 attaches the elastic member 261 and the reinforcing member 265 to each other. The first (upper) sub-adhesion member 267 is disposed on a lower surface of the elastic member 261 and an upper surface of the reinforcing member 265, such that an entire of the upper sub-adhesion member 267 is disposed between the elastic member 261 and the reinforcing member 265.

The second (lower) sub-adhesion member 267 couples the attached elastic member 261 and the reinforcing member 265 to the driving circuit substrate 230 disposed on an opposite side of the reinforcing member 265 from the elastic member 261. The first and second sub-adhesion members 267 may include an. As illustrated in FIG. 7, two layers of the adhesion member 267 are alternated with the reinforcing member 265 and the elastic member 261, such that one of the layers of the adhesion member 267 is disposed on an outer surface of the screen spacer 260.

As described above, the display device according to the exemplary embodiments of the present invention, attaches the gasket with the reinforcing member to the driving circuit substrate to thereby reduce or effectively prevent the gasket from being pushed or deformed by the top chassis when the gasket contacts the top chassis. Also, the gasket of the display device according to the exemplary embodiment of the present invention maintains the top chassis and the circuit board separated from each other by a distance, and uses the reinforcing member to thereby reduce or effectively prevent an electrical short circuit between the top chassis and the circuit board. Advantageously, the display device according to the exemplary embodiment of the present invention efficiently shields the electromagnetic interference through the gasket to reduce or effectively prevent a malfunction caused by the electromagnetic interference.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A gasket comprising:
an elastic member absorbing an external shock;
a conductive member contacting an outer surface of the elastic member and surrounding the elastic member; and
a reinforcing member disposed between the elastic member and the conductive member, the reinforcing member including:
a bottom portion extending parallel to a bottom surface of the conductive member; and
a side portion extending inclined from the bottom portion and parallel to a side surface of the conductive member;
wherein the reinforcing member comprises a thin plate having characteristics of rigidity and flexibility, and polyethylene terephthalate ("PET").

2. The gasket of claim 1, wherein the reinforcing member is disposed substantially in an "L" shape, and contacts a bottom surface and one side of the elastic member.

3. The gasket of claim 2, wherein the reinforcing member is a single and continuous unit.

4. The gasket of claim 1, wherein the reinforcing member is disposed substantially in a "U" shape, and contacts a bottom surface and opposing sides of the elastic member.

5. The gasket of claim 4, wherein the reinforcing member is a single and continuous unit.

6. The gasket of claim 1, wherein the conductive member comprises non conductive fabric plated with a conductive material.

7. The gasket of claim 6, wherein the conductive member is disposed such that end portions of the conductive member overlap each other and a whole of a bottom of the elastic member.

8. The gasket of claim 1, wherein the bottom portion of the reinforcing member covers substantially entire upper surface of a bottom portion of the conductive member.

9. A gasket comprising:
an elastic member absorbing an external shock;
a conductive member contacting an outer surface of the elastic member and surrounding the elastic member;
a reinforcing member disposed between the elastic member and the conductive member, the reinforcing member including:
a bottom portion extending parallel to a bottom surface of the conductive member; and
a side portion extending inclined from the bottom portion and parallel to a side surface of the conductive member; and
a conductive adhesive disposed on and contacting an outer surface of the conductive member.

10. A screen spacer comprising:
an elastic member configured to absorb an external shock;
a reinforcing member disposed on one side of the elastic member;
a first adhesion member combining the reinforcing member with the elastic member; and
a second adhesion member disposed directly on an outer surface of the reinforcing member opposite to the elastic member, such that the second adhesion member is an outermost layer of the screen spacer.

11. The screen spacer of claim 10, wherein the reinforcing member comprises a thin plate with fixity.

12. The screen spacer of claim 10, wherein the elastic member comprises sponge.

13. A display device, comprising:
a display panel displaying images;
a driving circuit substrate supplying a driving signal to the display panel;
a chassis surrounding an edge of the display panel; and
a gasket attached to the driving circuit substrate and contacting the chassis, and
wherein the gasket comprises:
  an elastic member absorbing an external shock;
  a conductive member contacting an outer surface of the elastic member, such that the conductive member surrounds the elastic member; and
  a reinforcing member disposed between the elastic member and the conductive member, the reinforcing member including:
    a bottom portion extending parallel to a bottom surface of the conductive member; and
    a side portion extending inclined from the bottom portion and parallel to a side surface of the conductive member,
wherein the gasket grounds the driving circuit substrate and the chassis.

14. The display device of claim 13, wherein the reinforcing member comprises a thin plate having rigidity and flexibility.

15. The display device of claim 14, wherein the reinforcing member is disposed substantially in an "L" shape, extends along a bottom surface and one side surface of the elastic member, and is a continuous unit.

16. The display device of claim 14, wherein the reinforcing member is disposed substantially in a "U" shape, extends along a bottom surface and opposing outer side surfaces of the elastic member, and is a continuous unit.

17. The display device of claim 13, wherein the conductive member comprises a non conductive fabric plated with a conductive material.

18. The display device of claim 17, wherein the conductive member is disposed such that both distal ends of the conductive member overlap each other and a whole of a bottom of the elastic member.

19. The display device of claim 13, further comprising, a screen spacer disposed on the driving circuit substrate, and between the driving circuit substrate and the chassis, the screen spacer including an elastic member, and a reinforcing member disposed on a bottom of the elastic member.

* * * * *